United States Patent
Chen et al.

(10) Patent No.: US 9,666,507 B2
(45) Date of Patent: May 30, 2017

(54) THROUGH-SUBSTRATE STRUCTURE AND METHOD FOR FABRICATING THE SAME

(71) Applicant: UNITED MICROELECTRONICS CORP., Hsin-Chu (TW)

(72) Inventors: Chun-Hung Chen, Tainan (TW); Chien-Li Kuo, Hsinchu (TW); Ming-Tse Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/556,215

(22) Filed: Nov. 30, 2014

(65) Prior Publication Data

US 2016/0155685 A1    Jun. 2, 2016

(51) Int. Cl.
- *H01L 23/48* (2006.01)
- *H01L 21/768* (2006.01)
- *H01L 23/532* (2006.01)

(52) U.S. Cl.
CPC ...... *H01L 23/481* (2013.01); *H01L 21/76898* (2013.01); *H01L 23/53238* (2013.01); *H01L 2924/0002* (2013.01)

(58) Field of Classification Search
CPC ....... H01L 23/48; H01L 23/481; H01L 29/40; H01L 23/532; H01L 23/53228
USPC ................. 257/753, 253, 621, 762
See application file for complete search history.

(56) References Cited

U.S. PATENT DOCUMENTS

| | | | |
|---|---|---|---|
| 8,742,590 B2 | 6/2014 | Beyne | |
| 2006/0043598 A1* | 3/2006 | Kirby | B82Y 10/00 257/774 |
| 2008/0121421 A1* | 5/2008 | Kashiwakura | H05K 1/0251 174/262 |
| 2008/0257591 A1* | 10/2008 | Ikeda | H05K 1/119 174/255 |
| 2012/0160696 A1* | 6/2012 | Araki | C25D 11/024 205/171 |
| 2012/0261179 A1* | 10/2012 | Yamamoto | H01L 23/49827 174/264 |
| 2013/0302980 A1* | 11/2013 | Chandrashekar | C23C 16/045 438/666 |
| 2014/0353027 A1* | 12/2014 | Osaki | H05K 1/115 174/264 |
| 2015/0214134 A1* | 7/2015 | Ogiso | H01L 23/481 257/753 |
| 2015/0311154 A1* | 10/2015 | Sunohara | H01L 23/49827 257/774 |

* cited by examiner

*Primary Examiner* — Chuong A Luu
(74) *Attorney, Agent, or Firm* — Winston Hsu; Scott Margo

(57) ABSTRACT

A method for fabricating through-substrate structure is disclosed. The method includes the steps of: providing a substrate; forming a through-substrate hole and a through-substrate trench in the substrate; and forming a metal layer in the through-substrate hole and the through-substrate trench for forming a through-substrate via and a through-substrate conductor having a void therein.

12 Claims, 4 Drawing Sheets

THROUGH-SUBSTRATE STRUCTURE AND METHOD FOR FABRICATING THE SAME

BACKGROUND OF THE INVENTION

1. Field of the Invention

The invention relates to a method for fabricating integrated structure, and more particularly, to a method of forming a through-substrate structure with through-substrate via and through-substrate conductor having void therein.

2. Description of the Prior Art

Through-silicon via technique is a novel semiconductor technique, which mainly servers to solve the problem of electrical interconnection between chips and belongs to a new 3D packing field, and also produces products that meet the market trends of "light, thin, short and small" through the 3D stacking technique and also provides wafer-level packages utilized in micro-electronic mechanic system (MEMS), and photoelectronics and electronic devices.

The through-silicon via technique drills holes in the wafer by etching or laser then fills the holes with conductive materials, such as copper, polysilicon or tungsten to form vias, i.e. conductive channels connecting inner regions and outer regions. The wafer or the dice is then thinned to be stacked or bonded together to form a 3D stack IC. By using this approach, the wire bonding procedure could be omitted. Using etching or laser to form conductive vias not only omits the wire bonding but also shrinks the occupied area on the circuit board and the volume for packing. The inner connection distance of the package created by using the through-silicon via technique, i.e. the thickness of the thinned wafer or the dice, is much shorter compared with the conventional stack package of wire bonding type. The performance of the 3D stack IC would therefore be much better in many ways, including faster transmission, and lower noise. The advantage of the shorter inner connection distance of the through-silicon via technique becomes much more pronounced in CPU, flash memory and memory card. As the 3D stack IC could be fabricated to equate the size of the dice, the utilization of through-silicon via technique becomes much more valuable in the portable electronic device industry.

However in the state of the art there are still key issues which need to be resolved in order to integrate these TSV connections in a reliable way with good device performances: The utilization of a through-silicon bar-like structure surrounding the through-silicon via for shielding purpose typically results in overly small critical dimension as the dimension of through-silicon via decreases, causing poor plating performance. Hence, how to resolve issue in the fabrication of through-silicon structure has become an important task in this field.

SUMMARY OF THE INVENTION

A method for fabricating through-substrate structure is disclosed. The method includes the steps of: providing a substrate; forming a through-substrate hole and a through-substrate trench in the substrate; and forming a metal layer in the through-substrate hole and the through-substrate trench for forming a through-substrate via and a through-substrate conductor having a void therein.

According to another aspect of the present invention, a through-substrate structure is disclosed. The through-substrate structure includes a through-substrate conductor in a substrate, in which the through-substrate conductor comprises a void and the void is substantially vacant.

According to another aspect of the present invention, a through-substrate structure is disclosed. The through-substrate structure includes a through-substrate conductor in a substrate, in which the through-substrate conductor comprises a metal layer enclosing a void therein.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 illustrate a method for fabricating through-substrate structure according to a preferred embodiment of the present invention.

DETAILED DESCRIPTION

Figure 1:
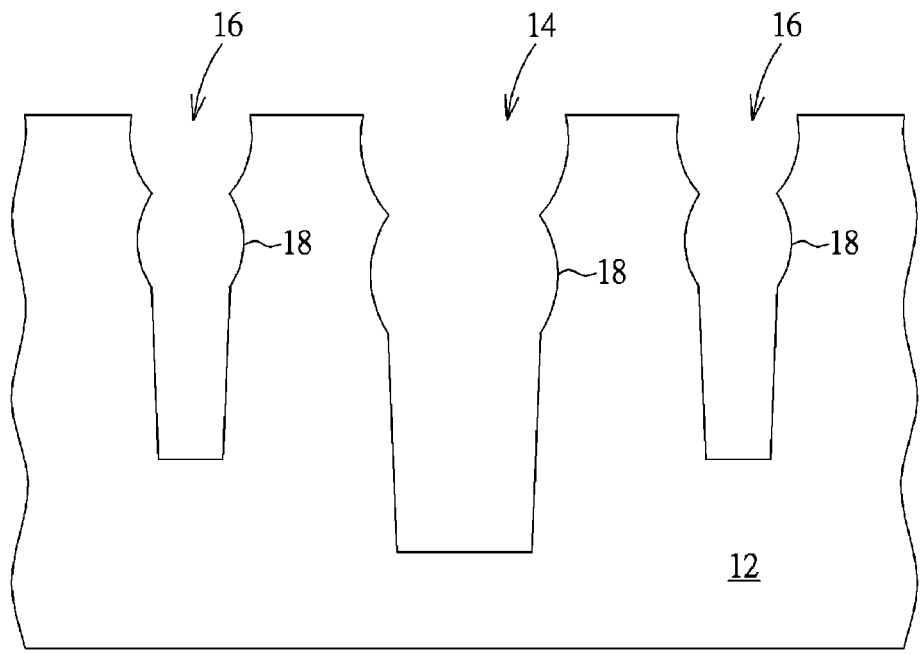

Referring to FIGS. 1-6, FIGS. 1-6 illustrate a method for fabricating through-substrate structure according to a preferred embodiment of the present invention. As shown in FIG. 1, a substrate 12 is first provided, in which the substrate 12 could be composed of monocrystalline silicon, gallium arsenide (GaAs), silicon on insulator (SOI) layer, epitaxial layer, or other known semiconductor material, but not limited thereto. Depending on the demand of the product, at least a metal-oxide semiconductor (MOS) transistor (not shown) or other semiconductor devices with interlayer dielectric (ILD) layer formed atop may be fabricated on the substrate 12, in which the MOS transistor could include typical transistor structures such as gate electrode, spacer, lightly doped drains, source/drain regions and/or salicides.

Next, at least one photo-etching process is conducted to form a through-substrate hole 14 and a through-substrate trench 16 in the substrate 12, in which the through-substrate hole 14 and the through-substrate trench 16 could be formed simultaneously or by separate process. Preferably, the through-substrate trench 16 is formed to surround the through-substrate hole 14 according to a geometric shape layout, such as a circular shape or a rectangular shape. In addition, the through-substrate hole 14 is fabricated with substantially greater dimension and greater depth than the through-substrate trench 16. For example, the depth of the through-substrate hole 14 is greater than the depth of the through-substrate trench by 8 to 10 μm. For instance, the through-substrate hole 14 in this embodiment is formed with a diameter of 6 μm and a depth of 54 μm, while the through-substrate trench 16 is formed with a diameter of 1 μm and a depth of 40 μm, but not limited thereto.

Preferably, the formation of the through-substrate hole 14 and the through-substrate trench 16 is accomplished by conducting a deep reactive ion etch (DRIE) process. DRIE process is a highly anisotropic etch process having the potential to create deep penetration, steep-sided holes and trenches, in which a common DRIE process used in this embodiment is a Bosch process. The Bosch process is also known as pulsed or time-multiplexed etching, which alternates repeatedly between two modes to achieve nearly vertical structures. The first mode of the Bosch process involves a standard, nearly isotropic plasma etch, in which the plasma contains some ions which attack the wafer from a nearly vertical direction. The second mode involves deposition of a chemically inert passivation layer that protects the entire substrate from further chemical attacking and prevents further etching. By using these two modes from the Bosch process, it would be desirable to form through-substrate hole 14 and through-substrate trench 16 with sidewall scallops 18.

Figure 2:
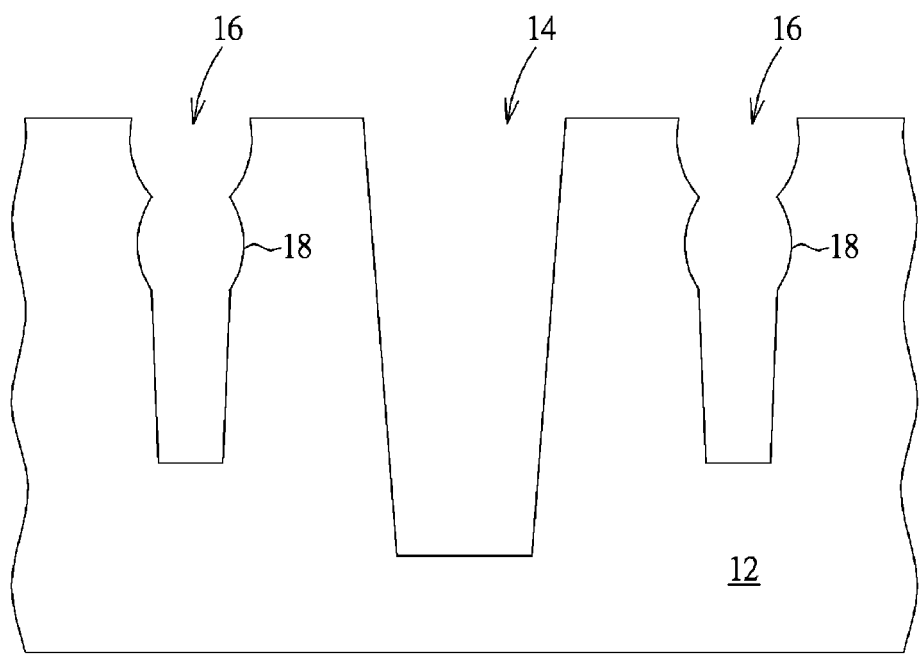

While both the through-substrate hole 14 and through-substrate trench 16 are fabricated with sidewall scallops 18 according to the default photo-etching process, it would also be desirable to conduct separate photo-etching processes for producing through-substrate hole 14 with non-wavy profile and through-substrate trench 16 with scallops. For instance, as shown in FIG. 2, a first photo-etching process could be carried out by using a patterned mask (not shown) to form a through-substrate hole 14 with straight surface profile, in which the etching process conducted in this instance could be a Bosch process or other etching processes. After through-substrate hole 14 is formed, another photo-etching process is conducted by using another patterned mask (not shown) to form a through-substrate trench 16 with sidewall scallops 18, in which the etching process conducted in this instance is preferably a Bosch process. This produces a mixed design of through-substrate cavities, including a through-substrate hole 14 formed without sidewall scallops and a through-substrate trench 16 formed with sidewall scallops.

It should also be noted that even though both the through-substrate hole 14 and the through-substrate trench 16 are fabricated by Bosch etch process in this embodiment, the formation of these two cavities 14 and 16 could also be achieved by using regular photo-etching process so that both the through-substrate hole 14 and the through-substrate trench 16 would contain straight and smooth sidewalls instead of sidewall scallops 18, which is also within the scope of the present invention.

Figure 3:
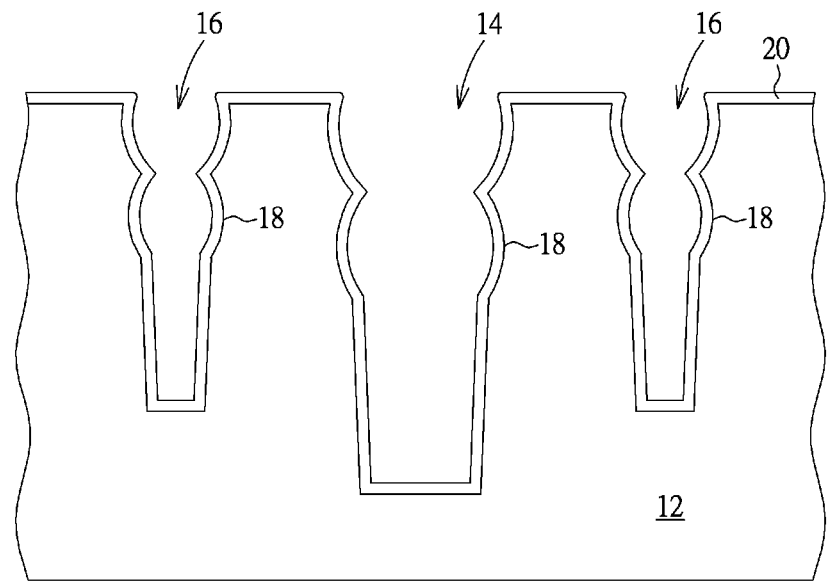

While either design of the through-substrate cavities from FIG. 1 or FIG. 2 could be used to carry out processes thereafter, the through-substrate cavities 14 and 16 from FIG. 1 is chosen in this embodiment as designated cavity profile for conducting later processes. For instance, after the cavities 14 and 16 are formed, as shown in FIG. 3, a liner 20 is formed by chemical vapor deposition (CVD) process on the top surface of the substrate 12 and sidewalls and bottom of the through-substrate hole 14 and through-substrate trench 16, in which the liner 20 could be composed of silicon oxide or silicon nitride, and could also be a single or composite layer. The liner 20 is preferably formed conformally lining the top surface of the substrate 12 and sidewalls and bottom of the through-silicon hole 14. Alternatively, the liner 20 could be formed by oxidizing the substrate 12, which is also within the scope of the present invention.

Figure 4:
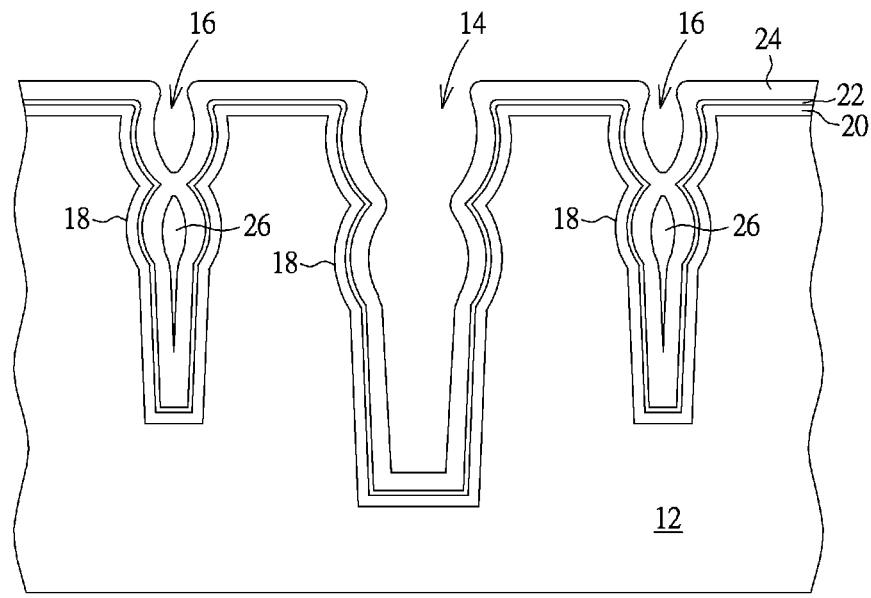

Next, as shown in FIG. 4, a barrier layer 22 and a seed layer 24 are formed on the liner 20, in which the barrier layer 22 is preferably selected from a group consisting of Ta, TaN, Ti, and TiN, but not limited thereto, and seed layer 24 is preferably consisting of copper, but not limited thereto.

In this embodiment, a physical vapor deposition (PVD) process is preferably conducted to deposit the barrier layer 22 and the seed layer 24 into the through-substrate hole 14 and through-substrate trench 16. This forms a void 26 sealed by the seed layer 24 only in the through-substrate trench 16 as the void 26 could be used to reduce mechanical stress, the electrical field, and capacitance effects in the surrounding area while the barrier layer 22 and seed layer 24 could provide significantly better shielding than oxide liner formed by CVD process.

It should be noted that factors including small critical dimension and large overhang induced by PVD process typically result in pinch off at the neck portion of the sidewall scallop 18 thereby facilitating the formation of void during PVD process. As the through-substrate trench 16 is formed with substantially smaller critical dimension than the through-substrate hole 14, it would be desirable by using the aforementioned approach to form a void 26 in the through-substrate trench 16 enclosed by the seed layer 24 while the through-substrate hole 14 due to its substantially greater dimension contain no void therein.

Moreover, it is to be noted that the PVD process is preferably conducted under a vacuum environment in this embodiment so that the void 26 formed by the PVD process is totally vacant (or containing no extra gas therein), thereby reducing the risk of explosion found in other air-filled environment.

Next, as shown in FIG. 5, a metal layer 28 preferably composed of copper is formed by electrochemical plating (ECP) process into the space above the void 26 in the through-substrate trench 16 and the remaining space in the through-substrate hole 14.

Figure 6:
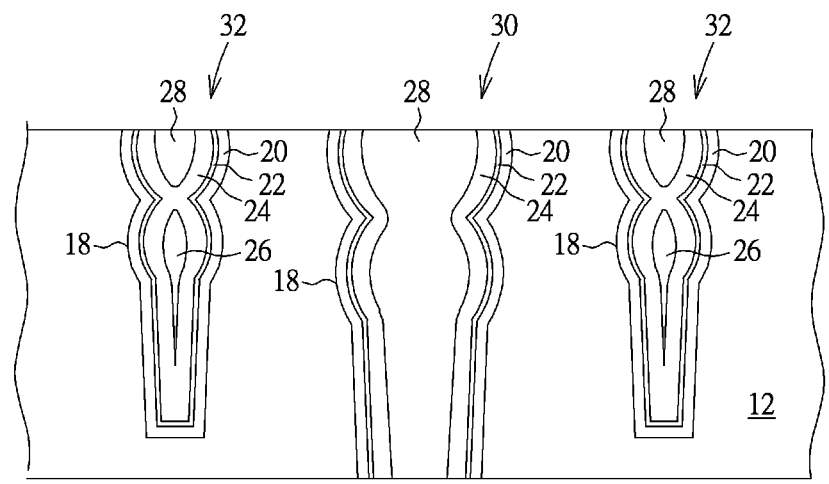

Next, as shown in FIG. 6, a planarizing process, such as a chemical mechanical polishing (CMP) process is conducted to remove part of the metal layer 28, part of the seed layer 24, part of the barrier layer 22, and part of the liner 20 to form a through-substrate via (TSV) 30 and a through-substrate conductor 32. Another CMP process could be conducted on the backside of the substrate 12 thereafter to remove part of the substrate 12 and part of the liner 20, part of the barrier layer 22, part of the seed layer 24, and part of the metal layer 28 of the through-substrate via 30 for revealing the bottom of the through-substrate via 30. Preferably, the CMP process conducted on backside of the substrate 12 only exposes the bottom of the through-substrate via 30 but does not expose the bottom of the through-substrate conductor 32. This completes the fabricating of a through-substrate structure according to a preferred embodiment of the present invention.

Figure 7:
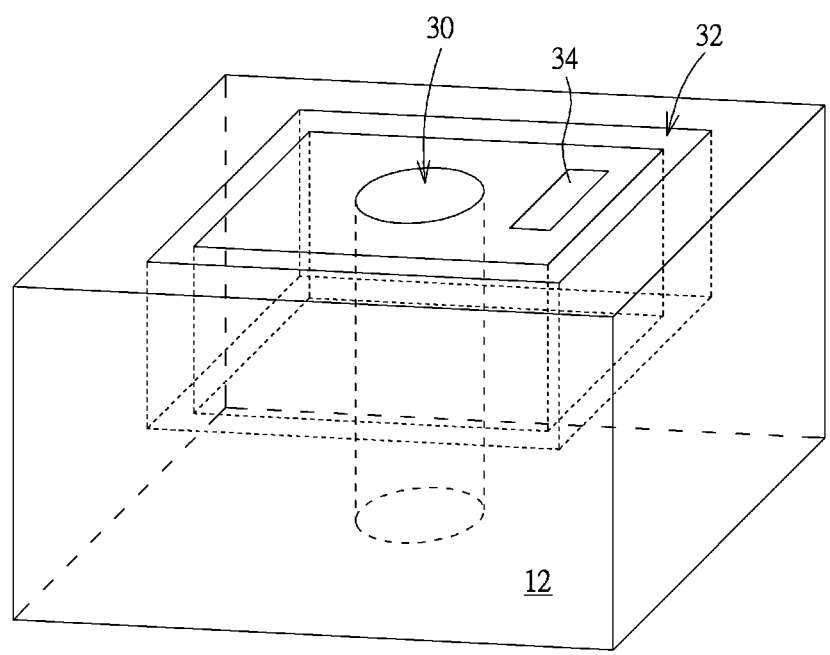
FIG. 7 illustrates a 3-dimensional view of the through-substrate structure according to an embodiment of the present invention.

Referring again to FIG. 6 and FIG. 7, FIG. 6 further illustrates a structural view of a through-substrate structure having both through-substrate via 30 and through-substrate conductor 32 while FIG. 7 illustrates a 3-dimensional view of the through-substrate structure. As shown in FIGS. 6 and 7, the through-substrate structure includes a through-substrate via 30 and a through-substrate conductor 32 surrounding the through-substrate via 30 according to a circular shape or a rectangular shape. Each of the through-substrate conductor 32 and the through-substrate via 30 is composed of an external liner 20, a barrier layer 22, a seed layer 24, a metal layer 28, and sidewall scallops 18. Preferably, the through-substrate conductor 32 contains a void 26 surrounded by the seed layer 24, in which the void 26 is substantially vacant, whereas the seed layer 24 of the through-substrate via 30 encloses no void therein.

Overall, the present invention discloses an approach of integrating a through-substrate via and a through-substrate conductor surrounding the through-substrate via for forming a through-substrate structure. The through-substrate via 30 could be placed either inside the through-substrate conductor 32 or outside the through-substrate conductor 32, in which the through-substrate via 30 inside the through-substrate conductor 32 is preferably connected to a radiofrequency (RF) device 34, and the through-substrate conductor 32 surrounding the inner through-substrate via 30 and RF device 34 could remain floating or be connected to a logic device (not shown). By constructing a through-substrate conductor 32 having void therein around the through-substrate via 30, it would be desirable to use the through-substrate conductor 32 for providing better shielding for noise as well as preventing interference between the two devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A through-substrate structure, comprising:
   a through-substrate conductor extending but not completely through a substrate, wherein the through-substrate conductor comprises a void and the void is substantially vacant and a bottom surface of the through-substrate conductor contacts the substrate directly; and
   a through-substrate via completely extending through the substrate.

2. The through-substrate structure of claim 1, further comprising:
   a through-substrate via in the substrate, wherein the through-substrate via is surrounded by the through-substrate conductor under 3-dimensional view of the through-substrate via and the through-substrate conductor, respectively.

3. The through-substrate structure of claim 2, wherein each of the through-substrate conductor and the through-substrate via comprises sidewall scallops.

4. The through-substrate structure of claim 2, wherein the through-substrate conductor surrounds the through-substrate via according to a circular shape or rectangular shape.

5. The through-substrate structure of claim 2, wherein the through-substrate via comprises a seed layer enclosing no void therein.

6. The through-substrate structure of claim 5, wherein the seed layer comprises copper.

7. A through-substrate structure, comprising:
   a through-substrate conductor in a substrate, wherein the through-substrate conductor comprises a seed layer enclosing a void therein and in direct contact with the void and a metal layer on the seed layer, wherein the void is enclosed by the seed layer completely, the seed layer being of a conformal structure made of copper, the metal layer filling a through-substrate hole, a through-substrate trench, but without filling the void.

8. The through-substrate structure of claim 7, further comprising:
   a through-substrate via in the substrate, wherein the through-substrate via is surrounded by the through-substrate conductor.

9. The through-substrate structure of claim 8, wherein each of the through-substrate conductor and the through-substrate via comprises sidewall scallops.

10. The through-substrate structure of claim 8, wherein the through-substrate conductor surrounds the through-substrate via according to a circular shape or rectangular shape.

11. The through-substrate structure of claim 8, wherein the through-substrate via comprises the seed layer enclosing no void therein.

12. The through-substrate structure of claim 11, wherein the seed layer comprises copper.

* * * * *